(12) United States Patent
Terada

(10) Patent No.: US 10,558,181 B2
(45) Date of Patent: Feb. 11, 2020

(54) PARAMETER CONTROL DEVICE AND STORAGE MEDIUM

(71) Applicant: YAMAHA CORPORATION, Hamamatsu-shi, Shizuoka-ken (JP)

(72) Inventor: Kotaro Terada, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 668 days.

(21) Appl. No.: 14/858,259

(22) Filed: Sep. 18, 2015

(65) Prior Publication Data

US 2016/0085221 A1 Mar. 24, 2016

(30) Foreign Application Priority Data

Sep. 24, 2014 (JP) .................................. 2014-193244

(51) Int. Cl.
*G05B 15/02* (2006.01)

(52) U.S. Cl.
CPC .................................... *G05B 15/02* (2013.01)

(58) Field of Classification Search
None
See application file for complete search history.

(56) References Cited

U.S. PATENT DOCUMENTS

| | | | |
|---|---|---|---|
| 6,704,032 B1 | 3/2004 | Falcon et al. | |
| 7,299,421 B2 | 11/2007 | Kohyama et al. | |
| 7,596,238 B2 | 9/2009 | Higashihara | |
| 7,945,060 B2 | 5/2011 | Terada et al. | |
| 9,368,156 B2 | 6/2016 | Kitayama et al. | |
| 2002/0174202 A1 | 11/2002 | Kohyama et al. | |
| 2009/0051664 A1 | 2/2009 | Oh | |
| 2010/0050106 A1 | 2/2010 | Koizumi et al. | |
| 2012/0250896 A1 | 10/2012 | Kamihara | |
| 2014/0126750 A1 | 5/2014 | Kitayama et al. | |

FOREIGN PATENT DOCUMENTS

| | | |
|---|---|---|
| CN | 1384487 A | 12/2002 |
| CN | 1612643 A | 5/2005 |
| CN | 101609665 A | 12/2009 |
| CN | 103809968 A | 5/2014 |
| EP | 1655993 A1 | 5/2006 |
| JP | H11112254 A | 4/1999 |

(Continued)

OTHER PUBLICATIONS

Extended European Search Report issued in European Appln. No. 15185623.4 dated Mar. 8, 2016.

(Continued)

*Primary Examiner* — Abul Kalam
(74) *Attorney, Agent, or Firm* — Rossi, Kimms & McDowell LLP

(57) ABSTRACT

When controlling values of a plurality of parameters in a predetermined device according to an operation by a user, values of parameters to be controlled are displayed in an array along an item axis on a parameter editing screen, an operation by the user to the parameter editing screen is detected, and when an operation to trace the screen in a direction of the item axis from a certain position is detected, a sequential control is performed, sequentially according to progress of the operation, to temporarily change to a specific value a value of each parameter corresponding to a position in the item axis direction where the trace operation is being performed.

9 Claims, 6 Drawing Sheets

(56) References Cited

FOREIGN PATENT DOCUMENTS

| JP | 2012128258 A | 7/2012 |
| WO | 2005011327 A1 | 2/2005 |
| WO | 2008126130 A1 | 10/2008 |

OTHER PUBLICATIONS

Office Action issued in Chinese Appln. No. 201510615858.3 dated Sep. 6, 2017. English translation provided.
Office Action issued in Japanese Appln No. 2014-193244 dated Mar. 27, 2018. English Translation provided.
"Digital Mixing Console QL Series QL StageMix V4.2 User's Guide", Yamaha Corporation, 2014. English translation provided.

{Fig. 1}
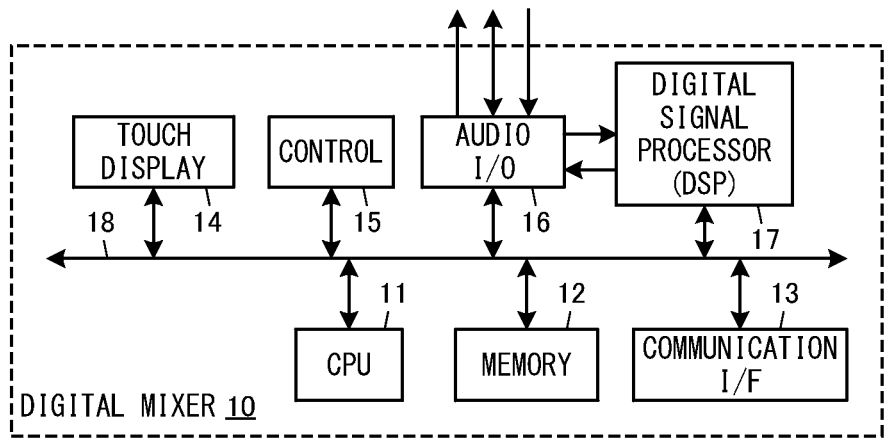
{Fig. 2}
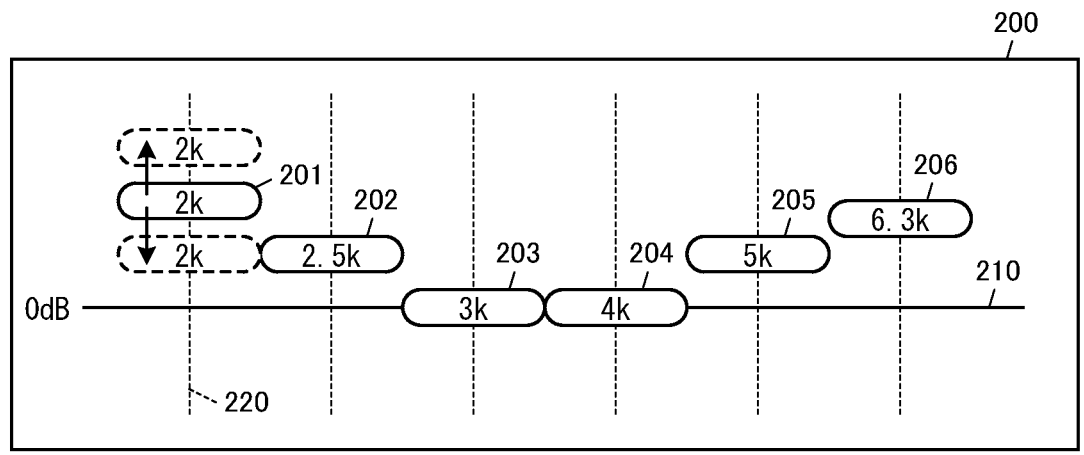
{Fig. 3}
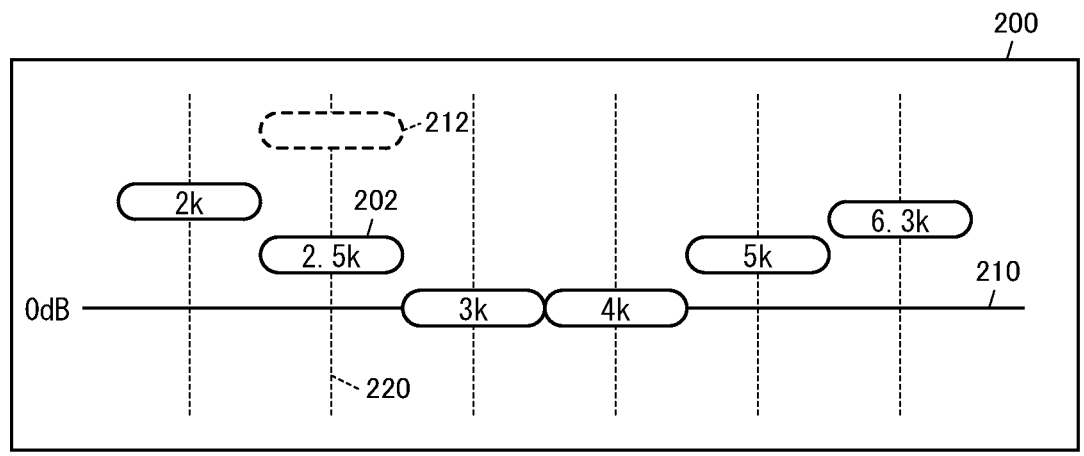

{Fig. 4}
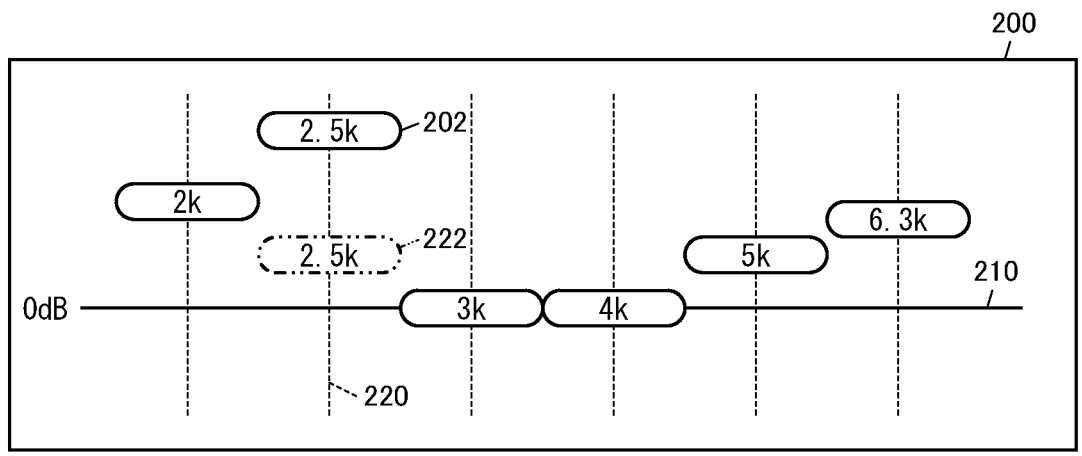
{Fig. 5}
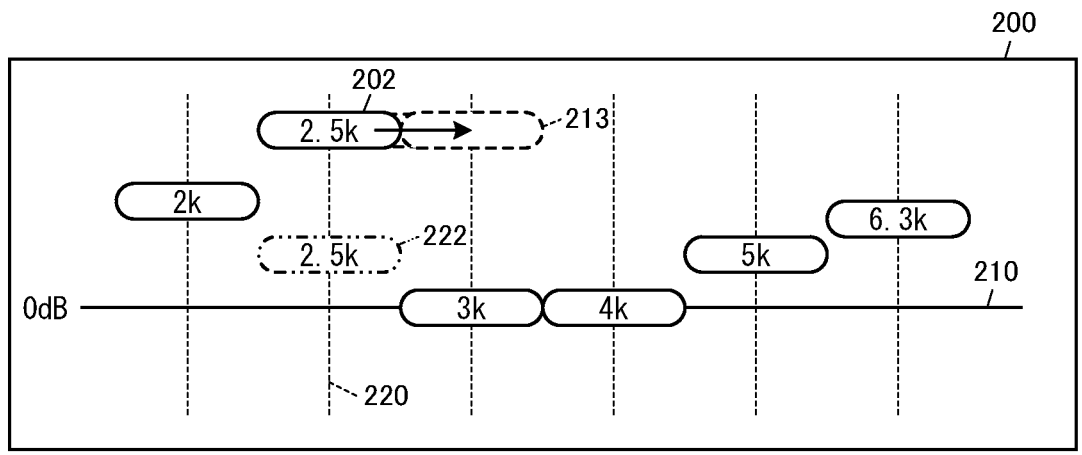
{Fig. 6}
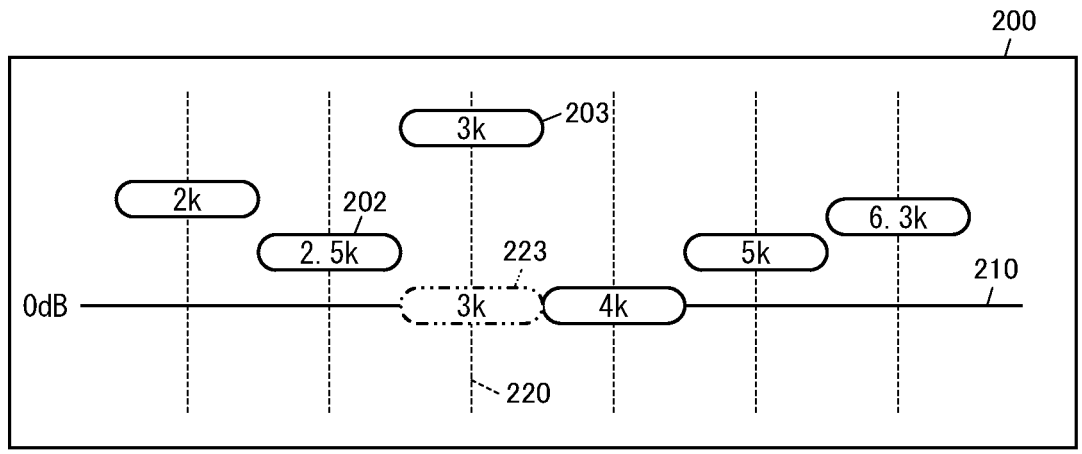

{Fig. 7}
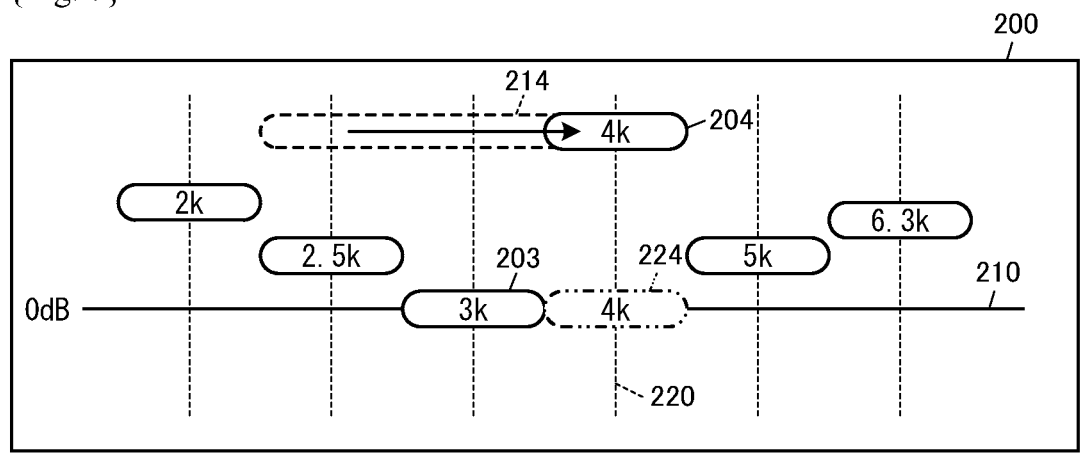
{Fig. 8}
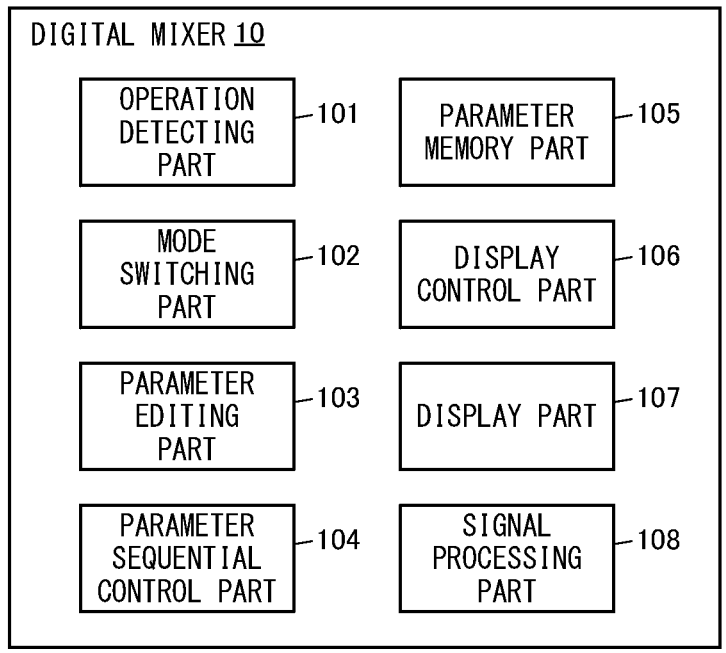

{Fig. 9}
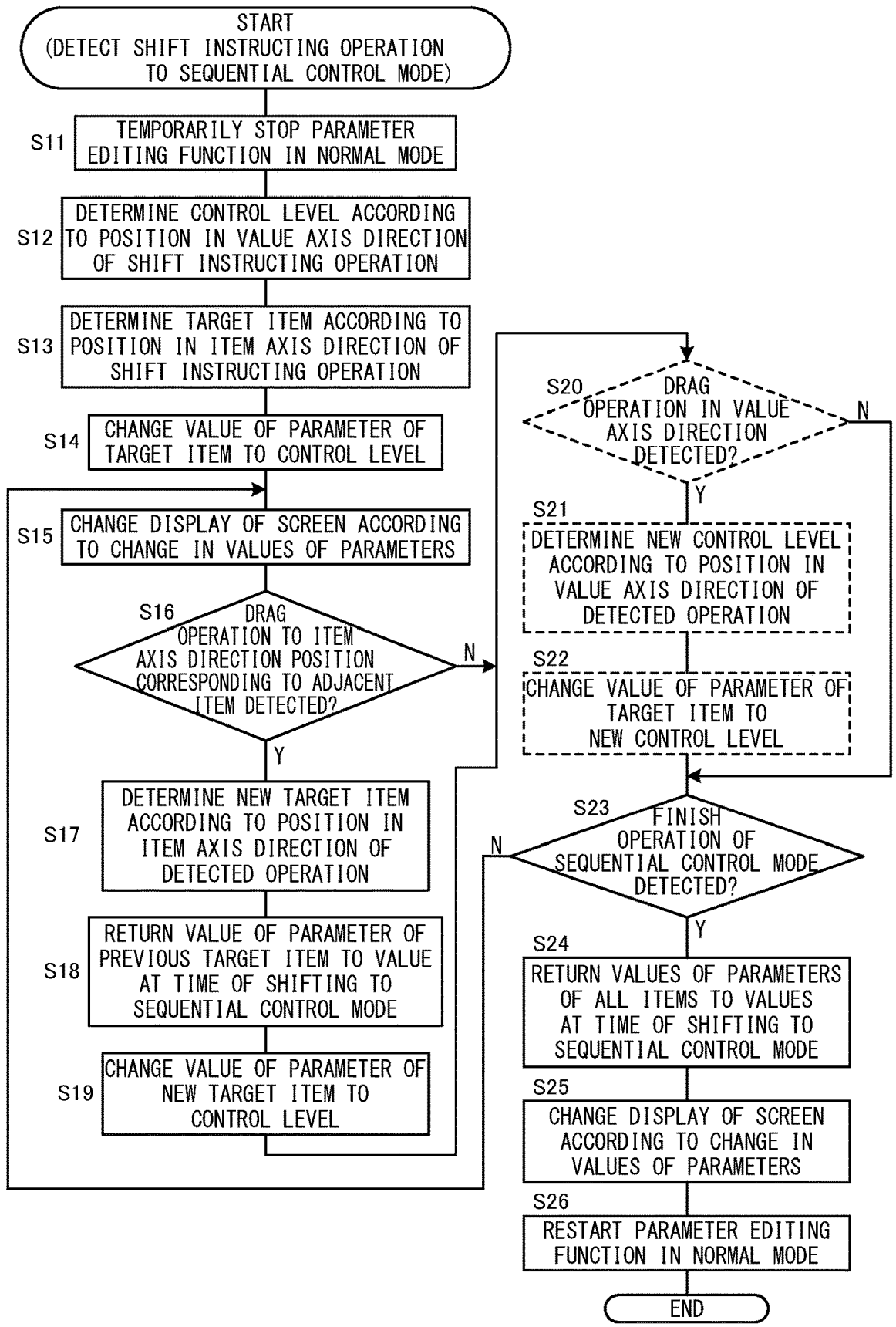

{Fig. 10}

| ITEM | 2k | 2.5k | 3k | 4k | 5k | 6.3k |
|---|---|---|---|---|---|---|
| SET VALUE IN NORMAL MODE | +10dB | +5dB | 0dB | 0dB | +5dB | +10dB |
| SEQUENTIAL CONTROL LAYER | trans-parent | trans-parent | trans-parent | trans-parent | trans-parent | trans-parent |

⇩

| ITEM | 2k | 2.5k | 3k | 4k | 5k | 6.3k |
|---|---|---|---|---|---|---|
| SET VALUE FOR SIGNAL PROCESSING (EFFECTIVE VALUE) | +10dB | +5dB | 0dB | 0dB | +5dB | +10dB |

{Fig. 11}

| ITEM | 2k | 2.5k | 3k | 4k | 5k | 6.3k |
|---|---|---|---|---|---|---|
| SET VALUE IN NORMAL MODE | +10dB | +5dB | 0dB | 0dB | +5dB | +10dB |
| SEQUENTIAL CONTROL LAYER | trans-parent | +20dB | trans-parent | trans-parent | trans-parent | trans-parent |

⇩

| ITEM | 2k | 2.5k | 3k | 4k | 5k | 6.3k |
|---|---|---|---|---|---|---|
| SET VALUE FOR SIGNAL PROCESSING (EFFECTIVE VALUE) | +10dB | +20dB | 0dB | 0dB | +5dB | +10dB |

{Fig. 12}
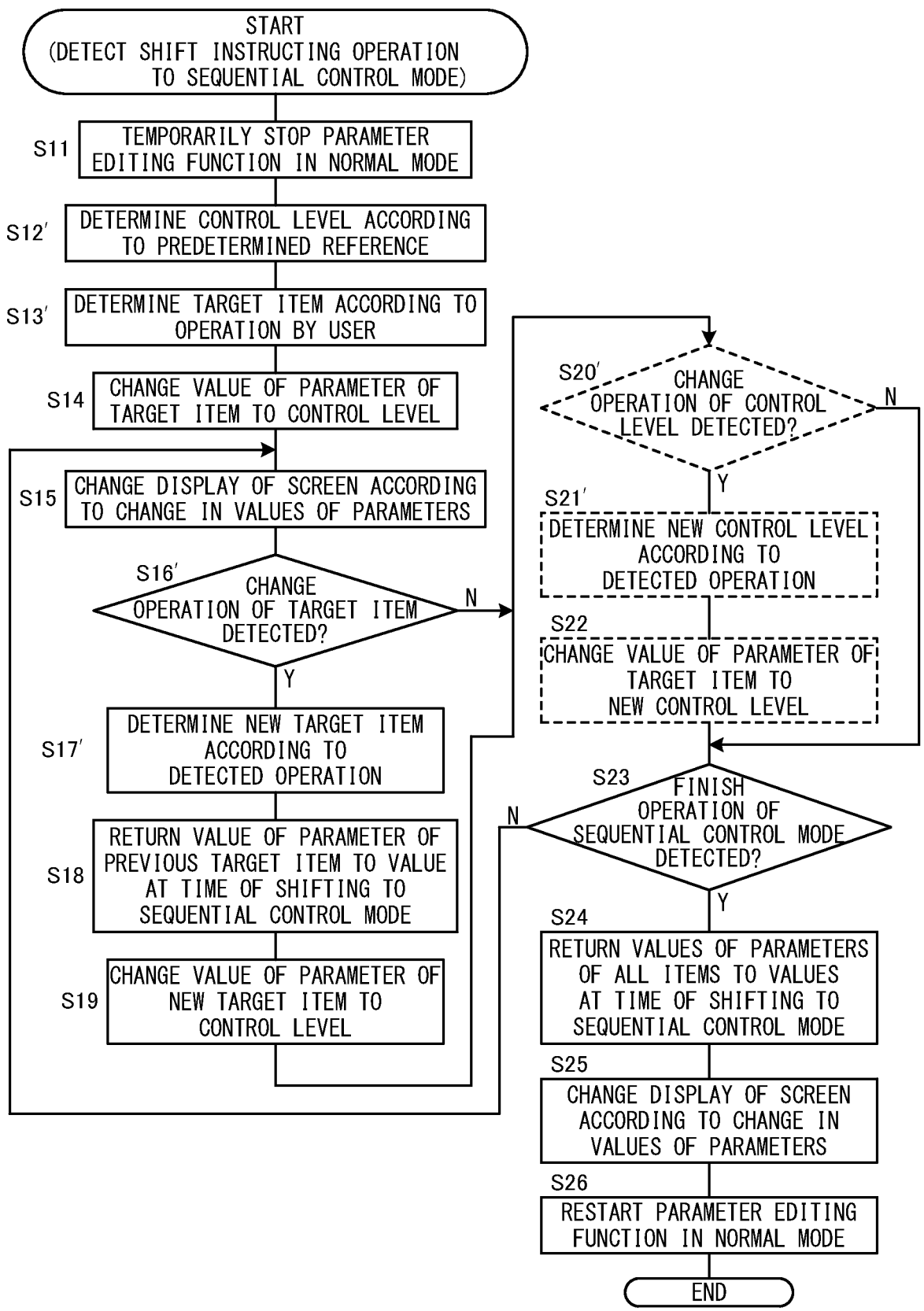

PARAMETER CONTROL DEVICE AND STORAGE MEDIUM

TECHNICAL FIELD

The invention relates to a parameter control device controlling values of a plurality of parameters in a predetermined device according to an operation by a user, and to a storage medium containing program instructions enabling a computer to function as such a parameter control device.

BACKGROUND ART

It has been conventionally known a parameter control device controlling values of a plurality of parameters in a predetermined device according to an operation by a user.

For example, NPL1 describes application software which, when installed and executed in a tablet-type portable terminal device, enables a user to adjust the values of parameters in a digital mixer by operating the portable terminal device.

CITATION LIST

Non Patent Literature

{NPL1} "DIGITAL MIXING CONSOLE QL SERIES QL StageMix V4.2 USER'S GUIDE", Yamaha Corporation, 2014

SUMMARY OF INVENTION

Technical Problem

Incidentally, in a site where a device, such as a digital mixer, is installed, the operating status of equipment is often tested while test values are set one by one for a plurality of parameters.

For example, the level of each frequency band in an equalizer is set to a large value one by one and sound is generated, no occurrence of howling is confirmed, and if howling occurs, the level of the band is lowered in setting for a performance.

Further, besides the digital mixer, for example, it is also conceivable to raise and lower an output of illumination equipment sequentially one by one to check the status of illumination.

However, in the conventional device, when the test is performed while test values are set one by one for a plurality of parameters like the above, laborious operations as follows were necessary. Specifically, after an operation to set one parameter to a test value, an operation to return it to the original value is performed, and then an operation to set the next parameter to a test value is performed, which are needed to be performed for the number of parameters to be tested. Accordingly, there is a problem that the test operation takes labor.

Further, in uses other than testing, similar problems occur when similar setting is performed.

It is an object of the present invention to solve such problems and enable to carry out, by a simple operation, control of the values of parameters to perform sequentially for a plurality of parameters actions of setting a parameter at an appropriate value and then returning it to the original value.

Solution to Problem

To attain the above object, a parameter control device of the invention is a parameter control device configured to control values of a plurality of parameters in a predetermined device according to an operation by a user, the parameter control device including: a display controller configured to display on a screen displayed by a display values of parameters to be controlled in an array along a first axis; a detector configured to detect an operation by the user on the screen; and a parameter controller configured to perform, when the detector detects an operation to trace the screen in a direction of the first axis, a sequential control to temporarily change, sequentially according to progress of the operation, to a specific value a value of each parameter corresponding to a position in the first axis direction where the trace operation is being performed.

In the above parameter control device, it is conceivable that the parameter controller sets, in the sequential control, a value of each parameter to the specific value only while the position in the first axis direction of the trace operation passes a position corresponding to the parameter, and returns the value of the parameter to an original value after the position of the trace operation passes the position corresponding to the parameter.

It is also conceivable that the specific value is a value corresponding to a position in a second axis direction different from the first axis direction where the trace operation is being performed.

Alternatively, it is also conceivable that the specific value is constant irrespective of the position of the trace operation.

The above configuration can be realized or embodied as an arbitrary style such as a system, a method, a computer program, a storage medium storing a computer program, other than the above device.

Advantageous Effects of Invention

The structure as described above enables to carry out, by a simple operation, control of the values of parameters to perform sequentially for a plurality of parameters actions of setting a parameter at an appropriate value and then returning it to the original value.

BRIEF DESCRIPTION OF DRAWINGS

FIG. 1 is a block diagram illustrating a hardware structure of a digital mixer as an embodiment of a parameter control device of the invention.

FIG. 2 is a diagram illustrating an example of an equalizer edit screen displayed by the digital mixer illustrated in FIG. 1.

FIG. 3 is a diagram for explaining a shift operation to a sequential control mode.

FIG. 4 is a diagram for explaining a state at a time of shifting to the sequential control mode.

FIG. 5 is a diagram for explaining an operation to the sequential control mode.

FIG. 6 is a diagram for explaining an operation to the sequential control mode, continuing from FIG. 5.

FIG. 7 is a diagram continuing likewise from FIG. 6.

FIG. 8 is a diagram illustrating a functional configuration of the digital mixer illustrated in FIG. 1.

FIG. 9 FIG. 9 is a flowchart of a process related to the function of the sequential control mode executed by a CPU of the digital mixer illustrated in FIG. 1.

FIG. 10 is a diagram for explaining a sequential control layer.

FIG. 11 is another diagram for explaining a sequential control layer.

FIG. 12 is a flowchart corresponding to FIG. 9 illustrating a process related to the function of the sequential control mode in a modification example.

DESCRIPTION OF EMBODIMENTS

Hereinafter, an embodiment for carrying out the invention will be explained specifically based on the drawings.

First, FIG. 1 illustrates a hardware structure of a digital mixer as an embodiment of a parameter control device of the invention.

As illustrated in FIG. 1, a digital mixer 10 includes a CPU 11, a memory 12, a communication I/F (interface) 13, a touch display 14, a control 15, an audio I/O 16, and a DSP (signal processing part) 17, which are connected via a system bus 18.

Among them, the CPU 11 is a controller for controlling the overall operation of the digital mixer 10, and achieves various control functions including a parameter setting and display control function, which will be described later, by executing a necessary control program stored in the memory 12.

The memory 12 is a storage having a rewritable non-volatile storage for storing control programs to be executed by the CPU 11 as well as data to be saved after the power is off and a storage area to be used as a work memory for the CPU 11.

The communication I/F 13 is an interface for communicating with other devices, such as another digital mixer whose parameter values can be controlled from the digital mixer 10. The communication may be performed either via a network or via a direct connection. Further, irrespective of whether it is wired or wireless, any communication path can be employed.

The touch display 14 is a display for displaying a screen indicating the values of parameters used by the digital mixer 10 as well as a setting status and an operating status of the digital mixer 10. This screen includes a GUI (Graphical User Interface) operable by the user, and the display thereof is controllable by the CPU 11. Further, the touch display 14 also functions as a detector for detecting an operation by a user to the screen being displayed including the GUI.

The control 15 is for accepting an operation to the digital mixer 10, and can be constituted of various keys, buttons, rotary encoders, knobs, sliders, and so on. Note that instead of or in addition to the touch display 14, a pointing device, such as a mouse or a track ball, may be provided to allow performing an operation to the GUI with the pointing device.

The audio I/O 16 is an interface for inputting and outputting an audio signal from/to the outside of the digital mixer 10.

The DSP 17 is an audio signal processor performing, in plural signal processing channels, various types of processing including mixing, equalizing, and adding effect on audio signals inputted from the audio I/O 16, and supplying results thereof to the audio I/O 16 to output them to the outside.

One of characteristic points of the above digital mixer 10 is that an operating mode is provided which enables to carry out, by a simple operation, control of the values of parameters to perform sequentially for a plurality of parameters actions of setting at a specific value and then returning it to the original value. This point will be explained below. In the following description, this operating mode will be called a "sequential control mode".

First, taking an example of setting a parameter related to an equalizer, which is one of signal processing functions provided by the DSP 17, differences between a parameter editing function in a normal mode other than the sequential control mode and the function of the sequential control mode will be explained.

FIG. 2 is an example of an equalizer screen for displaying the values of parameters related to the equalizer and accepting an editing operation thereof.

An equalizer screen 200 illustrated in FIG. 2 is a GUI screen displayed on the touch display 14, and is a screen for displaying values of gain parameters provided for six frequency bands from 2 k (kilohertz) to 6.3 k for one equalizer, and accepting an editing operation thereof. The gain parameter of one band corresponds to one item of parameter. Values of the parameters are respectively indicated by positions in a value axis 220 direction as a second axis of corresponding knobs 201 to 206, which are arrayed in a direction of an item axis 210 as a first axis and respectively correspond to the items.

In the normal mode, by an operation to choose one of the knobs 201 to 206 and drag it in the direction of the value axis 220, the user can set the value of the parameter corresponding to the operated control at the value corresponding to the drag destination position in the value axis 220 direction. Specifically, when this operation is detected, the CPU 11 changes the value of the parameter corresponding to the operated knob to the value corresponding to the destination position, and also updates the display position of the knob according to the value of the parameter after the change. In FIG. 2, the arrows indicate directions of the operation, and knobs depicted with dashed lines indicate the positions of the knob after the operation in the respective direction.

Further, when the drag operation in the item axis 210 direction is performed in the normal mode, the operation target item of parameter is changed to another one. However, as in the sequential control mode, which will be described later, even when the operation target item of parameter is changed, the value of the previous operation target item is not returned to the value before being changed. Therefore, when an operation to trace the equalizer screen 200 in the item axis 210 direction is performed, values of the parameters corresponding to the traced area are set at the same value corresponding to the position in the value axis 220 direction of the operation.

On the other hand, the user can shift the digital mixer 10 to the sequential control mode by, for example, holding down an arbitrary position on the equalizer screen 200. In this sequential control mode, through an operation to trace the equalizer screen 200 in the item axis 210 direction (for example, a drag operation), a sequential setting to temporarily set each value of the parameters corresponding to the position in the item axis 210 direction where the operation is being performed at a specific value can be performed sequentially according to the progress of the operation. That is, when the operation is detected, the CPU 11 temporarily set each value of the parameters corresponding to the position of the operation at a specific value sequentially according to the progress of the operation. The display positions of the knobs are updated according to the set values of the respective parameters. Used as this specific value here is the value corresponding to a position in the value axis 220 direction where the operation is detected, but this is not restrictive.

The operation in the sequential control mode will be explained in further detail by using FIG. 3 to FIG. 7.

FIG. 3 illustrates an example of a position where the shift operation (holding down) to the sequential control mode is performed as an operation position 212. Further, this operation also relates to the start of an operation to trace in the item axis 210 direction in the sequential control mode.

When the CPU 11 detects the shift operation at the operation position 212, and judges that the detected operation is a part of an operation to trace in the item axis 210 direction, first, the CPU 11 changes the value of the gain parameter of the 2.5 k band corresponding to the position in the item axis 210 direction of the operation to the value corresponding to the position in the value axis 220 direction of the operation (this value is called "control level"). This change is reflected in real time on the signal processing in the DSP 17. Further, the CPU 11 updates the display of the equalizer screen 200 according to the change as illustrated in FIG. 4.

In FIG. 4, the display position of the knob 202 corresponding to the 2.5 k band is a position indicating the control level. Further, the value of the same gain parameter before being changed is displayed with a knob 222 by a virtual line. On an actual screen, it is conceivable to be grayed out, displayed in a pale color, or the like.

Next, as illustrated in FIG. 5 it is assumed that the user advances the operation to trace in the item axis 210 direction from the operation position 212 of FIG. 3 to an operation position 213.

When judging that the position in the item axis 210 direction of the operation becomes the position corresponding to the next band by this operation, the CPU 11 returns the previously changed value of the gain parameter of the 2.5 k band to the value before being changed. On the other hand, the CPU 11 changes to the control level the value of the gain parameter of the 3 k band corresponding to the position in the item axis 210 direction of the current operation. That is, the CPU 11 sets the value of the gain parameter of the 2.5 k band at the control level only while the operation passes the area in the item axis 210 direction corresponding to this parameter, and thereafter returns it to the original value. The change is reflected in real time on the signal processing in the DSP 17. Further, the CPU 11 also updates the display of the equalizer 200 according to the change as illustrated in FIG. 6.

In FIG. 6, the display position of the knob 202 is returned to the same position as in FIG. 3, and the display position of the knob 203 corresponding to the 3 k band is a position indicating the control level. Further, the value of the gain parameter before being changed with respect to the 3 k band is displayed with a knob 223 by a virtual line, similarly to the case of FIG. 4.

Note that the value of the control level may be updated constantly according to the position in the value axis 220 direction of the operation at each time point, or the value of the control level may be kept constant ignoring an operation in the value axis 220 direction after an operation in the sequential control mode is started once. Here, the explanation proceeds assuming the former configuration, but effects of both the configurations will be described later.

Next, as illustrated in FIG. 7, it is assumed that the user advances the operation further forward as illustrated by an arrow from the operation position 213 of FIG. 5.

When judging that by the operation the position in the item axis 210 direction of the operation further changes to the position corresponding to the next band, the CPU 11 returns the previously changed value of the gain parameter of the 3 k band to the value before being changed. That is, the CPU 11 sets the value of the gain parameter of the 3 k band also at the control level only while the operation passes the area in the item axis 210 direction corresponding to the relevant parameter, and thereafter returns it to the original value. On the other hand, the value of the gain parameter of the 4 k band corresponding to the position in the item axis 210 direction of the current operation is changed to the control level. Reflection in the DSP 17 and update of the display are performed similarly to above.

Consequently, as illustrated in FIG. 7, the display position of the knob 203 returns to the same position as in FIG. 4, and the display position of the knob 204 corresponding to the 4 k band becomes a position indicating the control level. The knob 224 displays the value of the gain parameter before being changed with respect to the 4 k band.

Thereafter, every time the CPU 11 judges that the operation position changes to a position corresponding to another band, the CPU 11 returns the value of the gain parameter which has been changed to the control level to the value before being changed, and changes the value of the gain parameter of said another band to the control level.

Further, upon detecting the end of the operation to trace in the item axis 210 direction (for example, release of the finger from the touch display 14), the CPU 11 judges that this is an end operation of the sequential control mode, returns the values of all the parameters to the values at the point when the sequential control mode was started, finishes the operation of the sequential control mode, and returns to the normal mode.

By the above-described operation of the sequential control mode, the user can perform control such that by just performing a simple operation of tracing an arbitrary position in the value axis 220 direction on the equalizer screen 200 by the range of the position in the item axis 210 direction corresponding to a desired plurality of parameters, the plurality of parameters are set sequentially one by one at the control level and then returned to the original value.

The operation in such a sequential control mode can be performed while allowing the DSP 17 to input and process audio signals. Then, by this operation, a task such as testing the operating status of equipment while test values are set one by one for a plurality of parameters can be performed by a simple operation. Further, after the test is finished, the values of all the parameters can be returned to original values without particularly being aware of it.

At that time, when the operation in the value axis 220 direction is ignored in the sequential control mode and the value of the control level is kept constant, a common value can be set to the parameters, and a test or the like using the common value can be performed easily. Conversely, when the value of the control level is updated constantly according to the position in the value axis 220 direction of the operation at each time point, although a careful operation is necessary when the control level is desired to be kept constant, the values of a plurality of parameters can be controlled sequentially while arbitrarily adjusting the value of the parameter corresponding to the operation position.

Next, a functional configuration of the digital mixer 10 related to the above-described control of the values of parameters will be explained.

FIG. 8 is a block diagram illustrating the functional configuration.

The digital mixer 10 has an operation detecting part 101, a mode switching part 102, a parameter editing part 103, a parameter sequential control part 104, a parameter memory part 105, a display control part 106, a display part 107, and a signal processing part 108 as functions related to control of the values of parameters in the normal mode and the sequential control mode. The functions of these parts are achieved by the CPU 11 controlling the operation of the various hardware illustrated in FIG. 1.

Among the above, the operation detecting part 101 has a function of a detector detecting an operation, such as holding operation, drag operation or the like performed by a user on the screen displayed on the touch display 14. Incidentally, it is also possible to allow an operation to the screen displayed on the touch display 14 by operating a pointing device included in the control 15.

The mode switching part 102 has a function to switch the digital mixer 10 to the sequential control mode when the operation detecting part 101 detects a shift operation to the sequential control mode. Further, the mode switching part 102 also has a function to switch the digital mixer 10 to the normal mode when the operation detecting part 101 detects an end operation of the sequential control mode. This switching is performed by switching which of the functions of the parameter editing part 103 and the parameter sequential control part 104 is enabled, and the mode switching part 102 functions as a switching device.

The parameter editing part 103 has a function of a parameter editor for performing edit in the normal mode explained with FIG. 2 with respect to the values of parameters stored in the parameter memory part 105 according to an operation by the user detected by the operation detecting part 101.

The parameter sequential control part 104 is a parameter controller for performing sequential control which is control of parameter values in the sequential control mode explained with FIG. 3 to FIG. 7 with respect to the values of parameters stored in the parameter memory part 105 according to an operation by the user detected by the operation detecting part 101.

The parameter memory part 105 has a function to store the values of parameters which the DSP 17 uses for signal processing.

The display control part 106 has a function of a display controller for displaying a screen indicating the values of parameters stored in the parameter memory part 105, such as the equalizer screen 200, on the touch display 14. The setting or controlling of parameters performed by the parameter editing part 103 and the parameter sequential control part 104 are reflected on the screen as necessary.

The display part 107 has a function to display a screen according to control by the display control part 106, and corresponds to the function of the touch display 14.

The signal processing part 108 corresponds to the function of the DSP 17 which executes signal processing according to the values of parameters stored in the parameter memory part 105.

Next, a process executed by the CPU 11 of the digital mixer 10 related to the control of the values of parameters in the above-described sequential control mode will be described.

FIG. 9 is a flowchart of the process.

Upon detecting that a shift instructing operation to the sequential control mode is performed on the touch display 14 or the control 15, the CPU 11 of the digital mixer 10 starts the process illustrated in the flowchart of FIG. 9. Here, it is assumed that the shift instructing operation is holding down on the position corresponding to an arbitrary parameter in the parameter editing screen such as the equalizer screen 200. This holding down may be performed either by touching the touch display 14 with a finger or by holding down a click button of the pointing device of the control 15.

In the process of FIG. 9, the CPU 11 first temporarily stops the parameter editing function in the normal mode (S11). Thereafter, in order to perform control of the values of parameters in the sequential control mode, the CPU 11 proceeds to the process of step S12 and so on.

Next, the CPU 11 determines the control level according to the position in the value axis 220 direction of the portion where the detected shift instructing operation is made (S12). Further, the CPU 11 determines the item of parameter corresponding to the position in the direction of item axis 210 at the portion where the shift instructing operation is performed as a target item (item which is to be set at the control level) (S13). Thereafter, the CPU 11 changes the value of the parameter of the target item determined in step S13 to the control level determined in step S12 (S14). Then, the CPU 11 updates the display of the screen according to the change in the value of the parameter up to this point (S15). Note that a process of changing the value of the parameter in S14 may be performed to change the value gradually so as to prevent a rapid change. Of course, during this change, the CPU 11 may proceed to the next steps. The same applies to the process of changing the value of the parameter thereafter.

Next, the CPU 11 judges whether a drag operation to a position in the item axis 210 direction corresponding to the item adjacent to the target item determined in step S13 is detected (S16). Note that the drag operation may be performed by moving the finger touching the touch display 14 while the finger is touching it, or may be performed by moving the pointer of the pointing device while the click button is pressed. In either case, the drag operation corresponds to an operation to trace the parameter edit screen.

Further, when the drag operation includes both the component in the item axis 210 direction and the component in the value axis 220 direction, it may be judged that operations in these two axis directions are performed simultaneously. Alternatively, when the operations in these two axis directions are performed simultaneously, either one of the operations may also be disabled. For example, which of the axis directions the operation direction is close to is judged, and only the operation in the closer axis direction is enabled.

Further, it may be judged that there is an operation up to the current position constantly while the drag operation continues, or it may be judged that there is an operation up to the current position at a time when the operation is stopped once (change in the operation position no longer exists).

Then, when it is Yes in step S16, the CPU 11 determines that the item corresponding to the position in the item axis 210 direction which is the drag destination in the detected operation is a new target item (S17). Then, the CPU 11 returns the value of the parameter of the previous target item to the value at the time of shifting to the sequential control mode (S18). That is, after the drag operation passes the position corresponding to the previous target item, the value of the parameter of the previous target item is returned to the original value. Further, the CPU 11 changes the value of the parameter of the new target item determined in step S16 to the control level (S19).

When it is No in step S16, the CPU 11 skips steps S17 to S19 and proceeds to the next process.

Next, the CPU 11 judges whether a drag operation in the value axis 220 direction is detected (S20). When it is Yes in step S20, the CPU 11 determines a new control level according to the position in the value axis 220 direction of the drag destination in the detected operation (S21), and changes the value of the parameter of the target item to the new control level (S22).

When it is No in step S20, the CPU 11 skips steps S21 and S22 and proceeds to the next process.

Next, the CPU 11 judges whether an end operation of the sequential control mode is detected (S23). Here, it is assumed that an operation to finish the drag and release the finger or the click button is the end operation. When it is No in step S23, the CPU 11 returns to step S15 and repeats the process. When the values of parameters are changed in step S18, S19 or S22, the CPU 11 reflects the change on the display in step S15.

On the other hand, when it is Yes in step S23, the CPU 11 returns the values of parameters of all the items to the values at the time of shifting to the sequential control mode (S24) and updates the display of the parameter editing screen according to the change (S25). Thereafter, the CPU 11 restarts the editing function of parameters in the normal mode which is stopped in step S11 (S26), and the process of FIG. 9 is finished.

By the above processing, the CPU 11 functions as the parameter controller to perform control of the values of parameters in the sequential control mode explained by using FIG. 2 to FIG. 8.

Note that when the control in the value axis 220 direction is ignored in the sequential control mode and the value of the control level is made constant, it is just necessary to inhibit execution of the process of steps S20 to S22 depicted with dashed lines.

Next, data used for controlling the values of parameters in the sequential control mode will be described. FIG. 10 and FIG. 11 are explanatory views thereof.

As can be seen from the explanation of FIG. 9, in the sequential control mode, the values of parameters are set temporarily at the control level, and thereafter returned to values at the time of shifting to the sequential control mode. Such control is also achievable, for example, by saving the values of all the parameters as control targets at the time of shifting to the sequential control mode, changing the current values of the parameters constantly according to an operation by the user, and referring to the saved values when the values at the time of the shifting are needed.

However, in the digital mixer 10, as illustrated in FIG. 10 and FIG. 11, control using a sequential control layer is performed. Specifically, besides data of the set values of parameters in the normal mode, data of the sequential control layer corresponding to them are prepared, and the values (hereinafter called "effective values") of parameters to be actually reflected on the signal processing in the DSP 17 are generated based on these two groups of data.

Specifically, for the item to which "transparent" is set in the sequential control layer, the set value in the normal mode is used as it is as an effective value, and the item to which a value other than "transparent" is set in the sequential control layer, the value of the sequential control layer is used as an effective value.

Then, at the time of shifting to the sequential control mode, the sequential control layer in which the values of all the items are "transparent" is generated in the range of editable parameters at least in the parameter editing screen being displayed (see FIG. 10), and the values of parameters set in steps S14, S19 or S22 of FIG. 9 in the sequential control mode are set in the sequential control layer (see FIG. 11). Further, by setting the values of the parameters to "transparent" in the sequential control layer, the values of the parameters can be returned to the values at the time of shifting to the sequential control mode. Further, when the sequential control mode is finished, by deleting the sequential control layer, the values of all the parameters can be returned to the state at the time of shifting to the sequential control mode. Also by setting the values of all the items to "transparent", a similar effect can be obtained.

The sequential control layer in which the values of all the items are set to "transparent" does not, if present, affect the effective values of parameters, and thus there is no problem to leave it in the normal mode. That is, another conceivable method is to prepare the sequential control layer constantly, and set the values of all the items to "transparent" in a mode other than the sequential control mode.

By performing the control of the values of parameters as above, the values of parameters can be returned to the values at the time of shifting to the sequential control mode without performing a process to copy for saving data of numerous parameters at the time of shifting to the sequential control mode, or write back the saved data at the time of finishing the sequential control mode. Thus, the process can be accelerated.

This concludes the explanation of the embodiment, but the structure of the device, the specific structure of the screen, the specific procedures of processes, the operation methods, the types of displayable and editable parameters, and so on are not limited of course to those explained in the above-described embodiment.

For example, in the above-described embodiment, the holding operation to the position corresponding to an arbitrary parameter is the shift operation to the sequential control mode, but an operation to a position irrelevant to the parameters, an operation of a predetermined control included in the control 15, another touching operation or switching operation performed simultaneously with a holding operation, or the like may be handled as a shift operation to the sequential control mode. The same applies to an end operation of the sequential control mode.

Alternatively, the CPU 11 may be configured to judge that there is a shift operation to the sequential control mode only when a drag operation in the item axis 210 direction is detected after a holding operation is performed to the position corresponding to an arbitrary parameter.

Further, it may be configured to allow selecting the target item not by a drag but by a touch operation or a selecting operation to the position in the item axis 210 direction corresponding to a desired item. That is, not only an item displayed in a position adjacent to the current target item but also an arbitrary item can be set as a target item in an arbitrary order. Further, as an operation to trace the parameter editing screen, one other than a drag may be used.

Further, the value of the control level may be determined based on a reference other than the position of the shift instructing operation to the sequential control mode, such as setting to a predetermined fixed value, determining based on an operation different from the shift instruction to the sequential control mode.

Considering these, the process of FIG. 9 can be understood as being captured more generally as illustrated in FIG. 12. In FIG. 12, "'" is added to the step number to a portion different from FIG. 9.

As described in step S12' and step S13', the target item or the control level can be determined irrelevant to the shift instructing operation to the sequential control mode. As described in step S16' and step S17', the operation to change the target item is not limited to the drag in the item axis 210 direction. As described in step S20' and step S21', the operation to change the control level is not limited to the drag in the value axis 220 direction.

Further, in the sequential control mode, when drag operations are detected simultaneously at a plurality of positions, the control level and the target item corresponding to each of the operations may be set, and a process similar to FIG. 9 may be respectively executed as to the operations. That is, to each of a plurality of target items corresponding to the operations, the control level corresponding to each operation can be set temporarily. When the sequential control layer illustrated in FIG. 10 and FIG. 11 is used, by preparing the sequential control layer corresponding to each detected operation, and setting to each layer the value of a parameter to be set according to the corresponding operation, it is possible to easily achieve such control even when the number of operations being performed change dynamically. This is because an item to which "transparent" is set may be ignored regardless of the number of the layers, and only to an item to which a specific value is set, the specific value may be employed as an effective value.

Further, in the above-described embodiment, when the position of a drag operation passes the position in the item axis 210 direction corresponding to a certain parameter, the value of the parameter is immediately returned to the value at the time of shifting to the sequential control mode. However, it is conceivable to return it when a predetermined time passes after the passage, or to return it when the operation position moves to the position in the item axis 210 direction corresponding to a parameter located forward by a predetermined number. Further, it is conceivable to return it after a predetermined time passes from when the value of the parameter is set at the control level. These modes are useful when the function of the sequential control mode is used for a direction of performance, as will be described later.

Further, when the parameters cannot be displayed in one screen, it may be configured to allow changing the items of parameters displayed in the screen by scrolling the parameter display screen by operating an arbitrary position in the parameter display screen in the item axis 210 direction. In this case, the action corresponding to the same operation may differ depending on the mode such that, in the normal mode, scrolling is performed according to a drag operation, and in the sequential control mode, change of target items is performed according to a drag operation. Further, in the sequential control mode, change and scroll of the target item may be performed simultaneously according to a drag operation.

Alternatively, in either mode, scroll of the screen may be performed according to an operation (for example, swipe operation) different from the operation to instruct to change the target item. Further, scroll of the screen may be performed by the same operation in either of the normal mode and the sequential control mode.

Further, when the sequential control layer is used to generate an effective value of a parameter, rather than using the value of the sequential control layer as it is as the effective value, a calculation, such as adding or multiplying, may be performed between the set value in the normal mode and the value of the sequential control layer, and a result thereof may be used as the effective value.

Further, in the parameter display screen, the item axis 210 and the value axis 220 need not be orthogonal. As long as the direction of the operation can be detected by dividing into these two axes, they may cross at any angle. Further, when a component in one axis direction is quite smaller than a component in the other axis direction (with a ratio equal to or less than a predetermined value) regarding the direction of the detected operation, the smaller component may be ignored. Further, the axes need not be a straight line, and for example, the first axis may be arc-shaped.

Further, the target parameter for control and editing is not limited to the above-described gain parameter. For example, it may be a level parameter in a plurality of signal processing channels. Further, the target parameter is also not limited to the parameters used in the audio signal processing device like the digital mixer 10. For example, it may be a parameter indicating the light amount of each lamp used in a console for lighting control for controlling the light amounts of plural lamps.

Further, the use of the sequential control mode is not limited to the test of setting. It is also conceivable that the sequential control mode is used for a production during a performance. Examples include changing frequency characteristics of sound to be outputted one after another, outputting sounds from speakers at different positions in sequence, lighting lamps at different positions in sequence, and the like.

Further, in the present invention, it is not essential that the operation of the above-described normal mode is possible.

Further, the functions related to the control and editing of parameters which have been described can be provided in a device other than the device operating by using the values of the parameters (the digital mixer 10 in the above-described embodiment). For example, it can be provided in a remote controller or the like of the digital mixer 10. In this case, the remote controller may have dedicated hardware, or may be a general-purpose computer, such as a smartphone, a tablet computer, or a PC (personal computer). Such a remote controller need not have the DSP 17 and the signal processing part 108.

Further, the functions related to the control and editing of parameters may be achieved by cooperation of a plurality of devices. Conversely, when the digital mixer 10 is operated in a stand-alone manner, the communication I/F 13 need not be provided.

Further, an embodiment of a program of the present invention is a program for causing a computer to control necessary hardware so as to achieve the functions related to the control and editing of parameters explained in the above-described embodiment.

Such a program may be stored in a ROM, another non-volatile storage medium (flash memory, EEPROM, or the like), or the like originally provided in a computer. However, the program can also be provided by recording it in any non-volatile storage medium, such as memory card, CD, DVD, blue-ray disk, or the like. By installing and executing the program recorded in such a recording medium in a computer, the above-described procedures can be executed.

Moreover, it is also possible to download the program from an external device having the recording medium in which the program is recorded or an external device in which the program is stored in a storage, which is connected to a network, install the program in a computer, and execute the program.

Further, it is possible that the configurations and modifications thereof which have been described above can be applied in an appropriate combination within a range in which they do not contradict.

INDUSTRIAL APPLICABILITY

As is clear from the above explanation, the present invention enables to carry out, by a simple operation, control of the values of parameters to perform sequentially for a plurality of parameters actions of setting a parameter at an appropriate value and then returning it to the original value.

Thus, by applying the present invention, operability of parameter setting can be improved.

REFERENCE SIGNS LIST

10 . . . digital mixer, 11 . . . CPU, 12 . . . memory, 13 . . . communication I/F, 14 . . . touch display, 15 . . . control, 16 . . . audio I/O, 17 . . . DSP, 18 . . . system bus, 101 . . . operation detecting part, 102 . . . mode switching part, 103 . . . parameter editing part, 104 . . . parameter sequential control part, 105 . . . parameter memory part, 106 . . . display control part, 107 . . . display part, 108 . . . signal processing part, 200 . . . equalizer screen, 201 to 206, 222 to 224 . . . knob, 210 . . . item axis, 212, 213 . . . operation position, 220 . . . value axis

The invention claimed is:

1. A parameter control device comprising:
a display device configured to display a screen and permit a user to perform a trace operation of tracing on the screen along a first direction;
a memory storing instructions; and
a processor configured to implement the instructions stored in the memory and execute a plurality of tasks, including:
a display control task that controls the display device to display values of parameters to be controlled in an array during the trace operation;
a detecting task that detects the trace operation, including a current position in the first direction during the trace operation; and
a parameter control task that performs a sequential control that temporarily and sequentially changes a value of each parameter according to progress of the trace operation in the first direction, as detected by the detecting task,
wherein upon temporarily changing the value of a first parameter, among the parameters, to a specific value from an original value during the trace operation:
temporarily maintaining the specific value while the current position of the trace operation in the first direction is past a position corresponding to the first parameter; and
returning the specific value of the first parameter to the original value upon:
elapsing of a predetermined time after the current position of the trace operation passes the position of the first parameter; or
the current position of the trace operation reaching a position corresponding to a second parameter, among the parameters, in the first direction during the trace operation.

2. The parameter control device according to claim 1, wherein the parameter control task sets, in the sequential control, the value of first parameter to the specific value only while the position in the first axis direction of the trace operation passes the position corresponding to the first parameter.

3. The parameter control device according to claim 1, wherein the specific value is a value corresponding to a position along a second direction different from the first direction where the trace operation is being performed.

4. The parameter control device according to claim 1, wherein the specific value is constant regardless of the position of the trace operation.

5. The parameter control device according to claim 1, wherein the display device is a touch display device having a user interface operable by a user.

6. The parameter control device according to claim 1, wherein the display control task displays the parameters to be controlled on the screen as positions of virtual knobs that respectively correspond to the parameters and aligned along the first direction.

7. The parameter control device according to claim 6, wherein the virtual knobs are respectively provided as virtual sliders that respectively correspond to the parameters and aligned along the first direction, and operable along a second direction, different from the first direction.

8. A non-transitory machine-readable storage medium containing program instructions executable by a computer to execute a method of controlling a parameter control device having a display device configured to display a screen and permit a user to perform a trace operation of tracing on the screen along a first direction, the method comprising:
a display control step of controlling the display device to display values of parameters to be controlled in an array during the trace operation;
a detecting step of detecting the trace operation, including a current position in the first direction during the trace operation;
a parameter controlling step of performing a sequential control that temporarily and sequentially changes a value of each parameter according to progress of the trace operation in the first direction, as detected by the detecting step,
wherein upon temporarily changing the value of a first parameter, among the parameters, to a specific value from an original value during the trace operation:
temporarily maintaining the specific value while the current position of the trace operation in the first direction is past a position corresponding to the first parameter; and
returning the specific value of the first parameter to the original value upon:
elapsing of a predetermined time after the current position of the trace operation passes the position of the first parameter; or
the current position of the trace operation reaching a position corresponding to a second parameter, among the parameters, in the first direction during the trace operation.

9. A method of controlling a parameter control device having a display device configured to display a screen and permit a user to perform a trace operation of tracing on the screen along a first direction, the method comprising:
a display control step of controlling the display device to display values of parameters to be controlled in an array during the trace operation;
a detecting step of detecting the trace operation, including a current position in the first direction during the trace operation; and
a parameter controlling step of performing a sequential control that temporarily and sequentially changes a value of each parameter according to progress of the trace operation in the first direction, as detected by the detecting step,
wherein upon temporarily changing the value of a first parameter, among the parameters, to a specific value from an original value during the trace operation:
temporarily maintaining the specific value while the current position of the trace operation in the first direction is past a position corresponding to the first parameter; and
returning the specific value of the first parameter to the original value upon:

elapsing of a predetermined time after the current position of the trace operation passes the position of the first parameter; or the current position of the trace operation reaching a position corresponding to a second parameter, among the parameters, in the first direction during the trace operation.

\* \* \* \* \*